United States Patent
Lee et al.

(10) Patent No.: US 8,793,867 B2
(45) Date of Patent: Aug. 5, 2014

(54) HEAD NOZZLE AND APPARATUS FOR MOUNTING ELECTRONIC PARTS

(75) Inventors: Tae-Young Lee, Seongnam-si (KR); Boo-Goan Choi, Seongnam-si (KR)

(73) Assignee: Samsung Techwin Co., Ltd., Changwon-si (KR)

( * ) Notice: Subject to any disclaimer, the term of this patent is extended or adjusted under 35 U.S.C. 154(b) by 673 days.

(21) Appl. No.: 13/011,048

(22) Filed: Jan. 21, 2011

(65) Prior Publication Data
US 2011/0214286 A1 Sep. 8, 2011

(30) Foreign Application Priority Data
Mar. 3, 2010 (KR) .................. 10-2010-0019185

(51) Int. Cl.
*B23P 19/00* (2006.01)

(52) U.S. Cl.
USPC .............. 29/740; 29/739; 29/741; 29/742; 29/757

(58) Field of Classification Search
USPC ............... 29/739, 740, 741, 742, 757, 759
See application file for complete search history.

(56) References Cited

U.S. PATENT DOCUMENTS

| | | | | |
|---|---|---|---|---|
| 5,086,559 A | * | 2/1992 | Akatsuchi | 29/834 |
| 5,191,702 A | * | 3/1993 | Goedecke et al. | 29/742 |
| 5,491,888 A | * | 2/1996 | Sakurai et al. | 29/832 |
| 5,864,944 A | * | 2/1999 | Kashiwagi et al. | 29/833 |
| 6,148,511 A | | 11/2000 | Taguchi | |
| 7,640,657 B2 | * | 1/2010 | Van Gastel | 29/832 |
| 2001/0002509 A1 | * | 6/2001 | Suhara | 29/834 |
| 2002/0178578 A1 | * | 12/2002 | Okamoto et al. | 29/834 |
| 2007/0094868 A1 | * | 5/2007 | Ieizumi et al. | 29/743 |

FOREIGN PATENT DOCUMENTS

| | | |
|---|---|---|
| JP | 57-010941 A | 1/1982 |
| JP | 03-227595 A | 10/1991 |
| JP | 05-037194 A | 2/1993 |
| JP | 2001-094294 A | 4/2001 |
| JP | 2009-027207 | 2/2009 |
| JP | 2009-094296 A | 4/2009 |
| KR | 10-1998-072833 A | 11/1998 |
| KR | 10-2003-0009680 A | 2/2003 |
| KR | 10-2005-0109215 A | 11/2005 |
| KR | 10-2006-0083285 A | 7/2006 |

OTHER PUBLICATIONS

Office Action established for JP 2011-043578 (Nov. 29, 2011).

* cited by examiner

*Primary Examiner* — Carl Arbes
(74) *Attorney, Agent, or Firm* — Drinker Biddle & Reath LLP (57) ABSTRACT

A head nozzle unit includes a pair of motion guides located parallel to each other, a pair of movable blocks disposed on the pair of motion guides and movable independently of each other, a guide member transversely connected to the pair of motion guides via the pair of movable blocks, a pair of head nozzle parts disposed on opposite lateral surfaces of the guide member, the pair of head nozzle parts movable independently of each other and operable to pick up and mount electronic parts, and a driver that moves the pair of movable blocks in cooperation with one another and that moves the pair of head nozzle parts in predetermined directions. Further, an apparatus and method for mounting electronic parts includes the head nozzle unit. The pair of head nozzle parts alternately and sequentially performs a series of mounting processes of picking up the electronic parts and mounting the picked up electronic parts.

17 Claims, 10 Drawing Sheets

HEAD NOZZLE AND APPARATUS FOR MOUNTING ELECTRONIC PARTS

CROSS-REFERENCE TO RELATED APPLICATION

This application claims priority benefit under 35 U.S.C. §119 to Korean Patent Application No. 10-2010-0019185 filed on Mar. 3, 2010, the disclosure of which is hereby incorporated by reference in its entirety.

BACKGROUND

1. Field

Embodiments relate to an apparatus for mounting electronic parts. Other embodiments relate to a head nozzle unit, which allows a pair of head nozzle parts to alternately and sequentially perform a series of mounting processes of picking up electronic parts and mounting the electronic parts, and an apparatus and method for mounting the electronic parts.

2. Description of Related Art

In general, electronic part mounting apparatuses such as chip mounters are apparatuses that mount electronic parts on a printed circuit board loaded from outside the apparatuses at a preset mounting position.

The configuration of a conventional electronic part mounting apparatus is as follows.

The electronic part mounting apparatus includes a body having an XY gantry. Electronic part feeders such as tape feeders are detachably mounted on one side of the body.

Here, the electronic part feeders may be installed on a feeder base provided to the body to be arranged in parallel. The reason the number of electronic part feeders is plural is for feeding different electronic parts to the body.

The body is equipped with a conveyor for transferring the printed circuit board to a part mounting region of the body.

Further, the XY gantry is equipped with heads, which are installed to be movable along the XY gantry in X and Y directions. Each of the heads has a nozzle that receives the electronic part from the electronic part feeder and transfers the electronic part to the printed circuit board.

To increase the amount of electronic parts produced by a process of mounting the electronic parts on the printed circuit board using the electronic part feeders, a technique of installing two or more gantries on a single body has recently been studied.

In the body of a conventional electronic part mounting apparatus having two or more XY gantries, the XY gantries have four X beams and four Y beams, and four heads to move along the four X or Y beams.

The heads are independently operated in four working regions, i.e., four block regions, provided to the body.

Thus, each head independently performs a process of receiving an electrical signal from a controller, and mounting the electronic parts on a board at each block.

In this manner, when the conventional electronic part mounting apparatus performs different mounting processes using the plurality of heads, the amount of electronic products produced per unit time is increased. However, due to increases in the number of gantries and the number of heads, the entire area of the body is increased.

Further, the first and second block regions are interconnected by a pair of Y beams, and the third and fourth block regions are also interconnected by a pair of Y beams. Thus, the heads may come into physical collision with each other during moving along the Y beams due to erroneous operation control.

SUMMARY

Embodiments include a head nozzle unit in which a pair of head nozzle parts alternately and sequentially perform a series of mounting processes of picking up electronic parts and mounting the picked up electronic parts, and an apparatus and method for mounting the electronic parts.

Embodiments also include a head nozzle unit which operates a pair of head nozzle parts so as to not interfere with each other, thereby preventing a physical collision caused by superposition of movement paths while performing a mounting process, and an apparatus and method for mounting electronic parts.

According to one embodiment, a head nozzle unit includes: a pair of motion guides located parallel to each other; a pair of movable blocks disposed on the pair of motion guides and movable independently of each other; a guide member transversely connected to the pair of motion guides via the pair of movable blocks; a pair of head nozzle parts disposed on opposite lateral surfaces of the guide member, the pair of head nozzle parts movable independently of each other and operable to pick up and mount electronic parts; and a driver that moves the pair of movable blocks in cooperation with one another and that moves the pair of head nozzle parts in predetermined directions.

Here, a first end of the guide member may be hinged to one of the pair of movable blocks. A second end of the guide member may be coupled with a slide member that slides along the guide member, the slide member being hinged to the other of the pair of movable blocks. A lower end of the slide member may be slidably fitted into a sliding rail formed on the second end of the guide member.

The pair of motion guides may be formed as a pair of threaded shafts of ball screws, and the pair of movable blocks may be screwed around the pair of threaded shafts.

Further, the guide member may include rail channels in the opposite lateral surfaces thereof into which rail protrusions of the pair of head nozzle parts are fitted to guide sliding of the pair of head nozzle parts.

The driver may be connected with the pair of threaded shafts, and may include a pair of translation motors that provide a rotating force to each of the pair of threaded shafts, a pair of linear motors installed on the opposite lateral surfaces of the guide member and operable to move the pair of head nozzle parts, and a controller electrically connected with the pair of translation motors and the pair of linear motors and operable to control the pair of translation motors to be rotated in directions opposite or equal to each other and to control operation of the pair of linear motors.

The pair of motion guides may restrict movement widths of the pair of movable blocks, respectively. The controller may reciprocate the pair of movable blocks within the movement widths using the pair of translation motors, and simultaneously reciprocate the pair of head nozzle parts disposed on the guide member along the guide member using the pair of linear motors. The movement widths may be variably set for the controller.

The pair of movable blocks may be reciprocated within the movement widths to be moved in directions corresponding to each other to be located at positions opposite to each other, and the pair of head nozzle parts may be reciprocated along the guide member to be moved in directions corresponding to each other to be located at positions opposite to each other.

According to another embodiment, an apparatus for mounting electronic parts includes: a body having a part feeding region to which the electronic parts are fed, and a part mounting region which is spaced apart from the part feeding region by a predetermined distance to hold a board on which the electronic parts are mounted; and a head nozzle unit disposed above the body and including a pair of head nozzle parts that are reciprocated between the part feeding region and the part mounting region to pick up the electronic parts and to mount the electronic parts on the board.

Here, the head nozzle unit may further include: a pair of motion guides disposed above the body and parallel to each other; a pair of movable blocks disposed on the pair of motion guides and movable independently of each other; a guide member transversely connected to the pair of motion guides via the pair of movable blocks; a driver that moves the pair of movable blocks in cooperation with one another and that moves the pair of head nozzle parts in predetermined directions; and wherein the pair of head nozzle parts are disposed on opposite lateral surfaces of the guide member and movable independently of each other to be alternately located in the part feeding region and the part mounting region to pick up and mount the electronic parts.

A first end of the guide member may be hinged to one of the pair of movable blocks. A second end of the guide member may be coupled with a slide member that slides along the guide member, the slide member being hinged to the other of the pair of movable blocks. A lower end of the slide member may be slidably fitted into a sliding rail formed on the second end of the guide member.

Further, the pair of motion guides may be formed as a pair of threaded shafts of ball screws, and the pair of movable blocks may be screwed around the pair of threaded shafts.

The guide member may include rail channels in the opposite lateral surfaces thereof into which rail protrusions of the pair of head nozzle parts are fitted to guide sliding of the pair of head nozzle parts.

The driver may be connected with the pair of threaded shafts, and may include a pair of translation motors that provide a rotating force to each of the pair of threaded shafts, a pair of linear motors installed on the opposite lateral surfaces of the guide member and operable to move the pair of head nozzle parts, and a controller electrically connected with the pair of translation motors and the pair of head nozzle parts and operable to control the pair of translation motors to be rotated in directions opposite or equal to each other and to control operation of the pair of linear motors.

The pair of motion guides may restrict movement widths of the pair of movable blocks, respectively. The controller may reciprocate the pair of movable blocks within the movement widths using the pair of translation motors, and simultaneously reciprocate the pair of head nozzle parts disposed on the guide member along the guide member using the pair of linear motors, and the movement widths may be variably set for the controller.

The pair of movable blocks may be reciprocated within the movement widths to be moved in directions corresponding to each other to be located at positions opposite to each other, and the pair of head nozzle parts may be reciprocated along the guide member to be moved in directions corresponding to each other to be located at positions opposite to each other.

According to still another embodiment, a method of mounting electronic parts includes: disposing a pair of head nozzle parts above a part feeding region and a part mounting region, the pair of head nozzle parts located on opposite lateral surfaces of a guide member connecting an upper portion of the part feeding region and an upper portion of the part mounting region, each of the head nozzle parts picking up the electronic parts using vacuum suction in the part feeding region and mounting the picked up electronic parts on a board in the part mounting region; and alternately reciprocating the pair of head nozzle parts along the guide member between the part feeding region and the part mounting region to pick up the electronic parts using vacuum suction and mount the electronic parts on the board.

Here, disposing the pair of head nozzle parts may include: disposing a pair of motion guides above the part feeding region and the part mounting region to be parallel to each other; disposing a pair of movable blocks on the pair of motion guides; hinging a first end of the guide member to one of the pair of movable blocks, and hinging the other of the pair of movable blocks to a slide member that slides on an upper end of a second end of the guide member; and moving the pair of head nozzle parts along the opposite lateral surfaces of the guide member in directions opposite or equal to each other.

Further, alternately reciprocating the pair of head nozzle parts may include: reciprocating the pair of movable blocks along the pair of motion guides within a movement width which is variably set for a controller, using dynamic power supplied from outside a head nozzle unit comprising the head nozzle parts; alternately reciprocating the pair of head nozzle parts between the part feeding region and the part mounting region on the opposite lateral surfaces of the guide member using another dynamic power supplied from the outside; and picking up the electronic parts when each of the pair of head nozzle parts is located at the part feeding region, and mounting the picked up electronic parts on the board when each of the pair of head nozzle parts is located at the part mounting region.

In addition, the pair of movable blocks and the pair of head nozzle parts may be reciprocated at the same time.

BRIEF DESCRIPTION OF THE DRAWINGS

The foregoing and other features and advantages will be apparent from the more particular description of preferred embodiments, as illustrated in the accompanying drawings in which like reference characters refer to the same parts throughout the different views. The drawings are not necessarily to scale, emphasis instead being placed upon illustrating principles. In the drawings.

DETAILED DESCRIPTION

Various embodiments will now be described more fully with reference to the accompanying drawings in which some embodiments are shown. Inventive concepts may, however, be embodied in different forms and should not be construed as limited to the embodiments set forth herein. Rather, these embodiments are described so that this disclosure is thorough and complete and fully conveys inventive concepts to those skilled in the art. In the drawings, the sizes and relative sizes of layers and regions may be exaggerated for clarity.

It will be understood that when an element or layer is referred to as being "on," "connected to" or "coupled to" another element or layer, the element can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could instead be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concepts. As used herein, the singular forms "a," "an" and "the" are intended to include the plural forms as well, unless the context clearly indicates otherwise. It will be further understood that the terms "have," "having," "include," "including," "comprises" and/or "comprising," and forms thereof, when used in this specification and the appended claims, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concepts.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a head nozzle unit, and an apparatus and method for mounting electronic parts according to various embodiments will be described with reference to the accompanying drawings.

Figure 6:
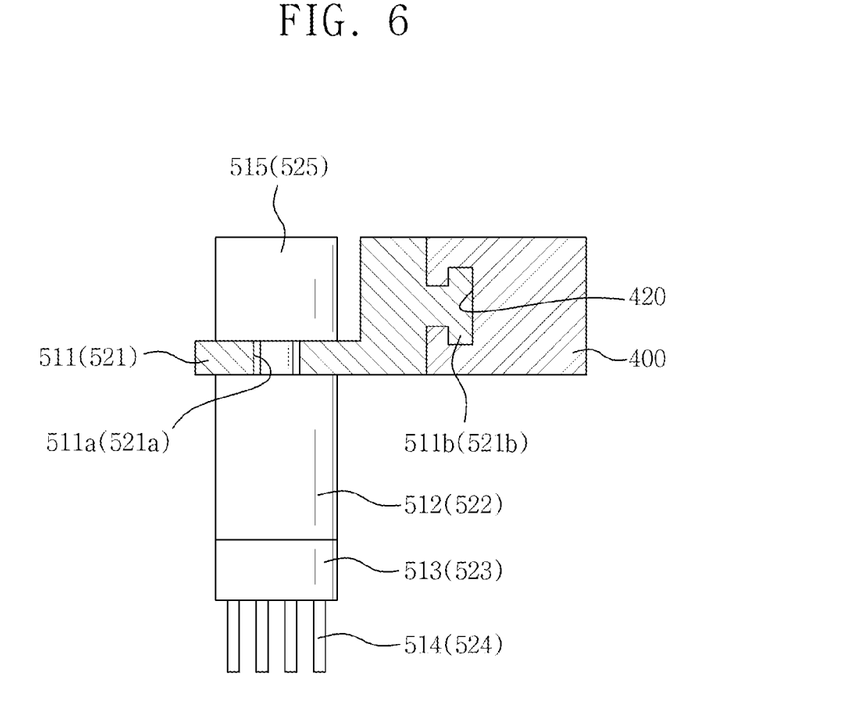
FIG. 6 is a cross-sectional view of first and second head nozzle parts according to an embodiment.
Figure 7:
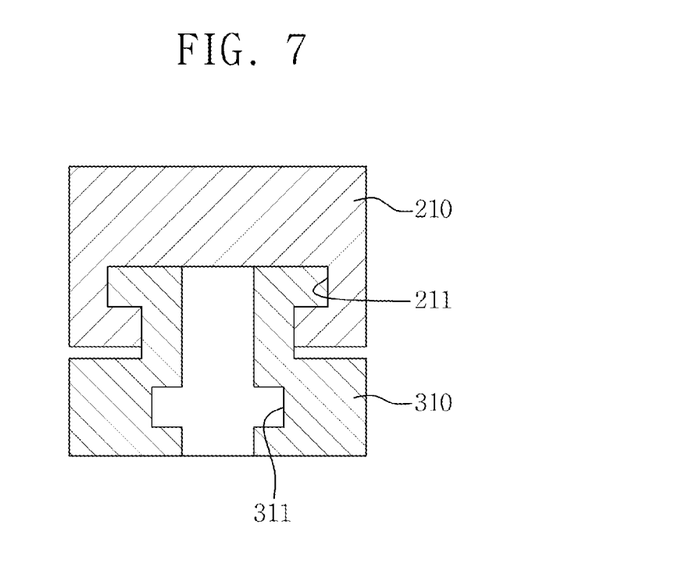
FIG. 7 is a cross-sectional view illustrating a joint relation between a motion guide and a movable block according to an embodiment.

FIGS. 1 through 5 are perspective views illustrating the operation of a head nozzle unit in an apparatus for mounting electronic parts according to an embodiment. FIG. 6 is a cross-sectional view of first and second head nozzle parts according to an embodiment. FIG. 7 is a cross-sectional view illustrating a joint relation between a motion guide and a movable block according to an embodiment. FIGS. 8 through 11 illustrate the operation of a head nozzle unit in an apparatus for mounting electronic parts according to an embodiment. FIG. 12 is a cross-sectional view illustrating a joint relation between a motion guide, i.e. a threaded shaft of a ball screw, and a movable block according to an embodiment.

First, the configuration of a head nozzle unit according to an embodiment will be described.

The head nozzle unit may be applied to an apparatus for mounting electronic parts, such as a chip mounter.

Figure 1:
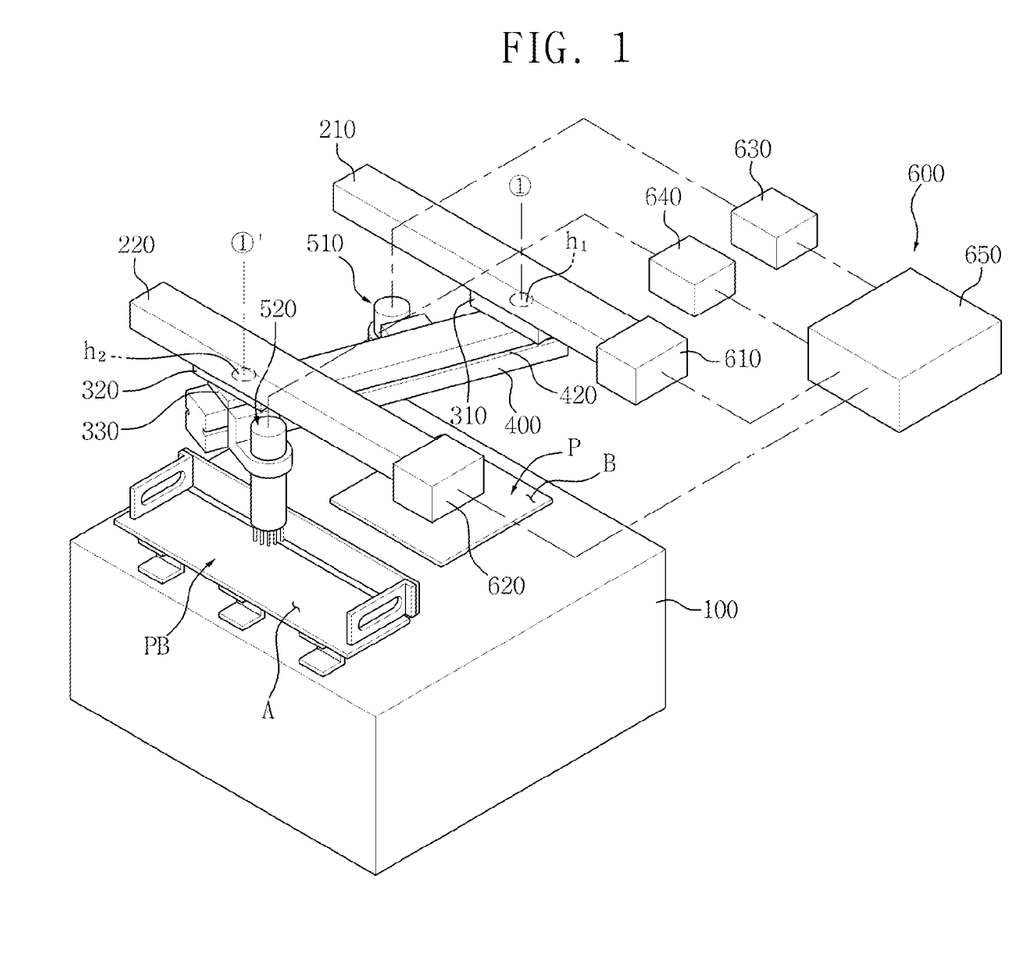
FIGS. 1 through 5 are perspective views illustrating the operation of a head nozzle unit in an apparatus for mounting electronic parts according to an embodiment.

Referring to FIG. 1 the head nozzle unit includes a pair of movable blocks 310 and 320 disposed on a pair of motion guides 210 and 220 located parallel to each other to be moved independently of each other, a guide member 400 transversely connected to the pair of motion guides 210 and 220 such that the pair of movable blocks 310 and 320 are moved, a pair of head nozzle parts 510 and 520 disposed on opposite lateral surfaces of the guide member 400 to be moved independently of each other for picking up and mounting electronic parts (not shown), and a driver 600 for moving the pair of movable blocks 310 and 320 in cooperation with one another as well as the pair of head nozzle parts 510 and 520 in mutually corresponding directions.

The pair of motion guides 210 and 220 are spaced apart from each other at a predetermined interval and are disposed parallel to and side by side with each other. Here, the motion guide 210 or 220 may be a threaded shaft of a ball screw as illustrated in FIG. 12, or a bar having a rail channel 211 as illustrated in FIG. 7. Further, the latter case is illustrated in FIGS. 1 through 7, and the former case is illustrated in FIGS. 8 through 12. In the latter case, the movable block 310 or 320 may partly fitted into and slide in the rail channel 211 formed in the bar.

The following description will be made taking the case where the motion guide 210 or 220 is the bar by way of example. Of course, in conjunction with the operation, the latter case may be substantially identical to the former case where the movable block 310 or 320 is moved on the motion guide implemented as the threaded shaft of the ball screw.

Referring to FIG. 1, each of the pair of movable blocks 310 and 320 is installed on each of the pair of motion guides 210 and 220 to be able to move independently of each other.

Here, the pair of motion guides 210 and 220 are divided into a first motion guide 210, and a second motion guide 220. The pair of movable blocks 310 and 320 are divided into a first movable block 310 sliding in the rail channel 211 of the first motion guide 210, and a second movable block 320 sliding in the rail channel 211 of the second motion guide 220.

The guide member 400 is a bar-shaped linear member having a predetermined length. One end of the guide member 400 is hinged to the first movable block 310 through a pin $h_1$. The other end of the guide member 400 is coupled with a slide member 330 which can slide along an upper surface of the guide member 400. A lower end of the slide member 330 is slidably fitted into a sliding rail formed on the other end of the guide member 400. The second movable block 320 is hinged to the slide member 330 through a pin $h_2$.

Of course, although not illustrated, the other end of the guide member 400 may be further provided with a guide rod (not shown) having a predetermined area and length such that the guide rod can pass through a through-hole (not shown) formed in the second movable block 320.

Meanwhile, the pair of head nozzle parts 510 and 520 are coupled to the guide member 400, and are divided into a first head nozzle part 510 and a second head nozzle part 520.

Here, the opposite lateral surfaces of the guide member 400 may be formed with rail channel 420 in a lengthwise direction.

The first head nozzle part 510 is installed on one lateral surface of the guide member 400, and the second head nozzle part 520 is installed on the other lateral surface of the guide member 400. Here, the first head nozzle part 510 may be disposed on one end of the guide member 400, and the second head nozzle part 520 may be disposed on the other end of the guide member 400. Thus, the first and second head nozzle parts 510 and 520 may be disposed to be opposite to each other with the guide member 400 interposed therebetween.

The first and second head nozzle parts 510 and 520 may be rail-joined with the guide member 400. In detail, the first and second head nozzle parts 510 and 520 are provided with rail protrusions 511b and 521b at respective ends thereof which are fitted into and slide in the rail channels 420 formed on the opposite lateral surfaces of the guide member 400.

Here, the pair of movable blocks 310 and 320 and the pair of head nozzle parts 510 and 520 may move under control of the driver 600.

The driver 600 is configured as follows.

The driver 600 includes a pair of translation motors 610 and 620 that are installed on the pair of motion guides 210 and 220 to control movement of the pair of motion guides 210 and 220, a pair of linear motors 630 and 640 that are installed on the opposite lateral surfaces of the guide member 400 to move the pair of head nozzle parts 510 and 520, and a controller 650. The controller 650 is electrically connected with the pair of translation motors 610 and 620, the pair of linear motors 630 and 640, and the pair of head nozzle parts 510 and 520. The controller 650 controls the pair of translation motors 610 and 620 to be rotated in directions opposite or equal to each other and controls operation of the pair of linear motors 630 and 640. Here, the pair of linear motors 630 and 640 may be replaced by rotary motors. The rotating directions may be substantially decided according to positions for picking up and mounting the electronic parts.

The pair of translation motors 610 and 620 are divided into a first translation motor 610 moving the first movable block 310 on the first motion guide 210, and a second translation motor 620 moving the second movable block 320 on the second motion guide 220. Thus, the first and second movable blocks 310 and 320 may be moved in corresponding directions in cooperation with the first and second translation motors 610 and 620.

Meanwhile, in the case where the pair of motion guides 210 and 220 are threaded shafts of ball screws, the pair of translation motors 610 and 620 may be either rotary motors that rotate a pair of threaded shafts or linear motors.

In the case where the translation motors 610 and 620 are rotary motors, the pair of rotary motors are divided into a first rotary motor, which is connected to the first motion guide 210 to rotate the first motion guide 210 in a forward or backward direction, and a second rotary motor, which is connected to the second motion guide 220 to rotate the second motion guide 220 in a forward or backward direction. The moving directions of the pair of movable blocks 310 and 320 may be dependent on the rotating directions of the pair of motion guides 210 and 220.

The pair of linear motors are divided into a first linear motor 630 reciprocating the first head nozzle part 510, which is disposed on one lateral surface of the guide member 400, along the guide member 400 and a second linear motor 640 reciprocating the second head nozzle part 520, which is disposed on the other lateral surface of the guide member 400, along the guide member 400.

The controller 650 controls the operation of the pair of translation motors 610 and 620 or the pair of rotary motors such that the first and second movable blocks 310 and 320 cooperate with the translation motors 610 and 620 in opposite directions. In detail, the controller 650 controls the first and second rotary motors such that the rotating direction of the first rotary motor is opposite or equal to that of the second rotary motor.

Further, the controller 650 controls the first and second linear motors 630 and 640 such that the first and second head nozzle parts 510 and 520 are moved on the opposite lateral surfaces of the guide member 400 in the opposite directions.

Here, the controller 650 may control the pair of translation motors 610 and 620 or the pair of rotary motors and the linear motors 630 and 640 to be driven simultaneously or independently.

The configuration of the pair of head nozzle parts (i.e., the first head nozzle part 510 and the second head nozzle part 520) will be described. The configuration of the first head nozzle part 510 may be substantially equal to that of the second head nozzle part 520.

The first head nozzle part 510 is disposed at one end of the guide member 400 to be able to move along the guide member 400.

The first head nozzle part 510 includes a first fixture 511 having a first rail protrusion 511b fitted into the rail channel 420 formed on one lateral surface of the guide member 400, and a first nozzle body 512 connected to the first fixture 511 and having a plurality of first spindles 514. The first fixture 511 may be provided with a rotary hole 511a. The first nozzle body 512 is rotatably installed in the rotary hole 511a. The first nozzle body 512 performs the same function as a cylinder body. A first cylinder shaft 513 that can move vertically is installed on a lower end of the first nozzle body 512. The first spindles 514 are installed on a lower end of the first cylinder shaft 513. Further, the first nozzle body 512 is connected with a first motor 515.

The first motor 515 may be electrically connected with the controller 650, and may receive an electrical signal from the controller 650 to thereby rotate in one direction.

In this case, the first spindles 514 are disposed at the lower end of the first cylinder shaft 513 in a circular shape. Further, the first spindles 514 may have an XY arrangement at the lower end of the first cylinder shaft 513, or a single first spindle may be installed at the lower end of the first cylinder shaft 513.

Although separately described above, the second head nozzle part 520 includes a second fixture 521 having a second rotary hole 521*a* and a second rail protrusion 521*b*, a second nozzle body 522, a second cylinder shaft 523, second spindles 524, and a second motor 525. The configuration of the first head nozzle part 510 is substantially equal to that of the second head nozzle part 520.

Next, the configuration of the apparatus for mounting electronic parts according to an embodiment will be described.

Referring to FIG. 1 again, the apparatus for mounting electronic parts includes a body 100, and a head nozzle unit installed on the body 100.

The body 100 is provided with a part feeding region A, to which the electronic parts are fed, and a part mounting region B, which is spaced apart from the part feeding region A by a predetermined distance and holds a board P on which the electronic parts are mounted.

The part feeding region A is a region to which the electronic parts are substantially fed from a tape feeder.

A number of tape feeders may be decided to be plural according to a type of the electronic part. The plurality of tape feeders may be arranged and mounted on a feeder base PB installed on one side of the body 100. Thus, when arranged on the feeder base PB, the tape feeders may form the part feeding region A to feed the electronic parts.

Further, the board P on which the fed electronic parts are mounted is on standby in the part mounting region B formed on the body 100. The part mounting region B is a region where the board P is on standby. The board P located in the part mounting region B may be transferred through a transfer mechanism such as a conveyer belt (not shown).

The head nozzle unit according to the embodiment is located above the body 100 such that the head nozzle unit can pick up the electronic part in the part feeding region A and transfer the picked-up electronic part to the mounted position of the board standing by in the part mounting region B.

Here, the configuration of the head nozzle unit disposed above the body 100 is substantially the same as described above, and so the detailed description thereof will be omitted.

However, the relative arrangement between components of the head nozzle unit and the body 100 will be additionally described.

In the pair of motion guides 210 and 220 of the head nozzle unit, the first motion guide 210 is located above the part mounting region B, while the second motion guide 220 is located above the part feeding region A. The first motion guide 210 is formed parallel to the second motion guide 220.

The guide member 400 of the head nozzle unit is disposed such that both ends thereof connect the part mounting region B and the part feeding region A, respectively.

Figure 8:
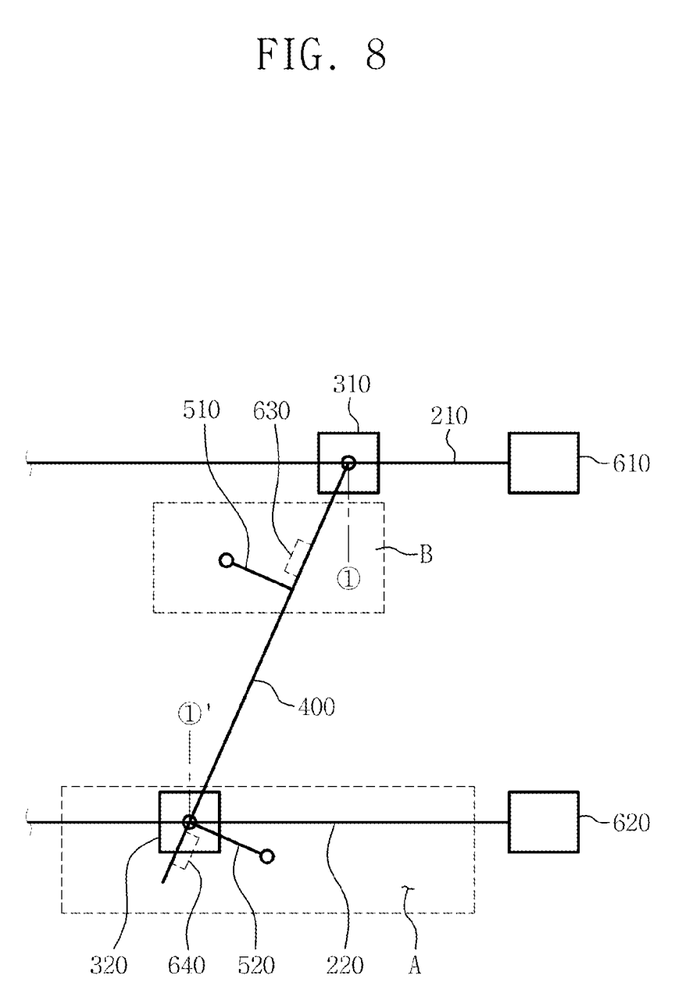
FIGS. 8 through 11 illustrate the operation of a head nozzle unit in an apparatus for mounting electronic parts according to an embodiment.

Referring to FIGS. 1 and 8, the first head nozzle part 510 is located on one lateral surface of the guide member 400, while the second head nozzle part 520 is located on the other lateral surface of the guide member 400. Thus, the first head nozzle part 510 is located above the part mounting region B, whereas the second head nozzle part 520 is located above the part feeding region A. Here, the disposed positions of the first and second head nozzle parts 510 and 520 are positions before being moved, i.e. initial positions.

Further, the first and second head nozzle parts 510 and 520 are disposed at the positions opposite to each other on the opposite lateral surfaces of the guide member 400.

Next, the operation of an apparatus for mounting electronic parts having the head nozzle unit according to an embodiment will be described with reference to the aforementioned configuration, and a method of mounting electronic parts using the apparatus for mounting electronic parts will be described.

First, referring to FIGS. 1 and 8, the pair of head nozzle parts 510 and 520, each of which picks up the electronic part in the part feeding region A, e.g., using vacuum suction, and then mounts the electronic part on the board in the part mounting region B, are disposed above the part feeding region A and the part mounting region B to be located on the respective opposite ends of the guide member 400 connecting an upper portion of the part feeding region A and an upper portion of the part mounting region B (first operation).

That is, the pair of motion guides 220 and 210 are disposed in parallel above the part feeding region A and the part mounting region B, respectively. As described above, the pair of motion guides 210 and 220 may be a pair of threaded shafts of ball screws (first and second threaded shafts) as illustrated in FIG. 12.

The pair of movable blocks 310 and 320, which can move in the opposite or equal directions, are disposed on the pair of motion guides 210 and 220. That is, the first movable block 310 is installed on the first motion guide 210, and the second movable block 320 is installed on the second motion guide 220.

One end of the guide member 400 is hinged to the first movable block 310 through the pin $h_1$. At the other end of the guide member 400, the second movable block 320 is hinged to the slide member 330, which can slide along an upper surface of the guide member 400, through the pin $h_2$. Thus, the first movable block 310 is rotatable at one end of the guide member 400, and the second movable block 320 is rotatable at an upper end of the slide member 330. The slide member 330 is slidable on the upper surface of the other end of the guide member 400 in a lengthwise direction of the guide member 400.

As illustrated in FIGS. 1 and 8, the first head nozzle part 510 is located at one end of one lateral surface of the guide member 400, and the second head nozzle part 520 is located at the other end of the other lateral surface of the guide member 400. That is, the first and second head nozzle parts 510 and 520 are located at the opposite ends of the guide member 400 to be opposite to each other with the guide member 400 interposed therebetween.

Here, the first head nozzle part 510 may be located above the part mounting region B, and the second head nozzle part 520 may be located above the part feeding region A.

The pair of head nozzle parts 510 and 520 are alternately reciprocated along the guide member 400 between the part feeding region A and the part mounting region B using the driver 600 (second operation).

In the second operation, the pair of movable blocks 310 and 320 are reciprocated along the pair of motion guides 210 and 220 within a predetermined movement width W1 using dynamic power supplied from the outside, preferably by the operation of the first and second translation motors 610 and 620, respectively. The pair of head nozzle parts 510 and 520 are alternately reciprocated between the part feeding region A and the part mounting region B at the opposite ends of the guide member 400 by another dynamic power supplied from the outside, preferably by the operation of the first and second linear motors 630 and 640, respectively. When located at the part feeding region A, each of the pair of head nozzle parts 510 and 520 picks up the electronic part, e.g., using vacuum suction.

When located at the part mounting region B, each of the pair of head nozzle parts 510 and 520 mounts the electronic part on the board P.

Here, the operation of the pair of movable blocks 310 and 320 cooperates with the operation of the pair of head nozzle parts 510 and 520 through the driver 600, and thereby the process of picking up and mounting the electronic part is repetitively performed. This process will be described.

Next, this process will be described in greater detail.

[First Standby Position and First Process Position]

Referring to FIGS. 1 and 8, the first movable block 310 is on standby at a first position ① on the first motion guide 210, and the second movable block 320 is on standby at a first position ①' on the second motion guide 220.

The first head nozzle part 510 is located above the part mounting region B at one end of one lateral surface of the guide member 400, and the second head nozzle part 520 is located above the part feeding region A at the other end of the other lateral surface of the guide member 400. This state is referred to as "standby position state" or "initial position state."

Here, the configuration of the first head nozzle part 510 is identical to that of the second head nozzle part 520, as described above.

In this state, the second head nozzle part 520 located above the part feeding region A can pick up the electronic part standing by in the part feeding region A, e.g., using vacuum suction. The process of picking up the electronic part using the second head nozzle part 520 is as follows.

A vacuum provider (not shown) provides vacuum suction to the second spindles 524, and then the second cylinder shaft 523 lowers the second spindles 524 to the part feeding region A. The lowered second spindles 524 pick up the electronic part standing by in the part feeding region A using the provided vacuum suction, and the second cylinder shaft 523 raises the second spindles 524, which grip the electronic part using the vacuum suction, to its original position.

Thus, the first head nozzle part 510 is in a state which does not pick up the electronic part, whereas the second head nozzle part 520 is in a state which does pick up the electronic part.

To describe this process of picking up the electronic part using the second head nozzle part 520, the operation of the first head nozzle part 510 will be representatively described.

The first fixture 511 of the first head nozzle part 510 is slidably fitted in the rail channel 420 formed in one lateral surface of the guide member 400. The first cylinder shaft 513 installed on a lower portion of the first nozzle body 512 connected to the first fixture 511 receives an electrical signal from the controller 650, and can raise and lower a plurality of first spindles 514 installed on a lower portion of the first cylinder shaft 513. The vacuum provider (not shown) receives an electrical signal from the controller 650, and can provide a vacuum suction for picking up the electronic part using the first spindles 514. The vacuum provider is provided with valves (not shown), receives an electrical signal from the controller 650, and can selectively block the vacuum suction provided to the first spindles 514.

In addition, the first nozzle body 512 is rotatably installed on the first fixture 511, and can be rotated by the first motor 515. The first motor 515 may be operated under control of the controller 650. Of course, the aforementioned second nozzle body 522 may also be rotated by the second motor 525.

The operation of the first head nozzle part 510 as described above is substantially equal to that of the second head nozzle part 520.

An operation position and a second process position will be described with reference to the foregoing.

[First Operation Position]

The controller 650 sends electrical signals to the first and second translation motors 610 and 620 and the first and second linear motors 630 and 640, thereby driving these motors 610, 620, 630 and 640.

Here, in the case where the first and second translation motors 610 and 620 are connected to the respective motion guides 210 and 220 that are the threaded shafts of the ball screws as illustrated in FIG. 12 by way of an example, the rotating directions may be opposite or equal to each other. In the case where the first and second motion guides 210 and 220 have a bar shape as illustrated in FIG. 1, the first and second translation motors 610 and 620 may be operated to move the first and second movable blocks 310 and 320 in the opposite or equal directions.

Thus, the first and second linear motors 630 and 640 may also be operated in the opposite or equal directions.

Figure 2:
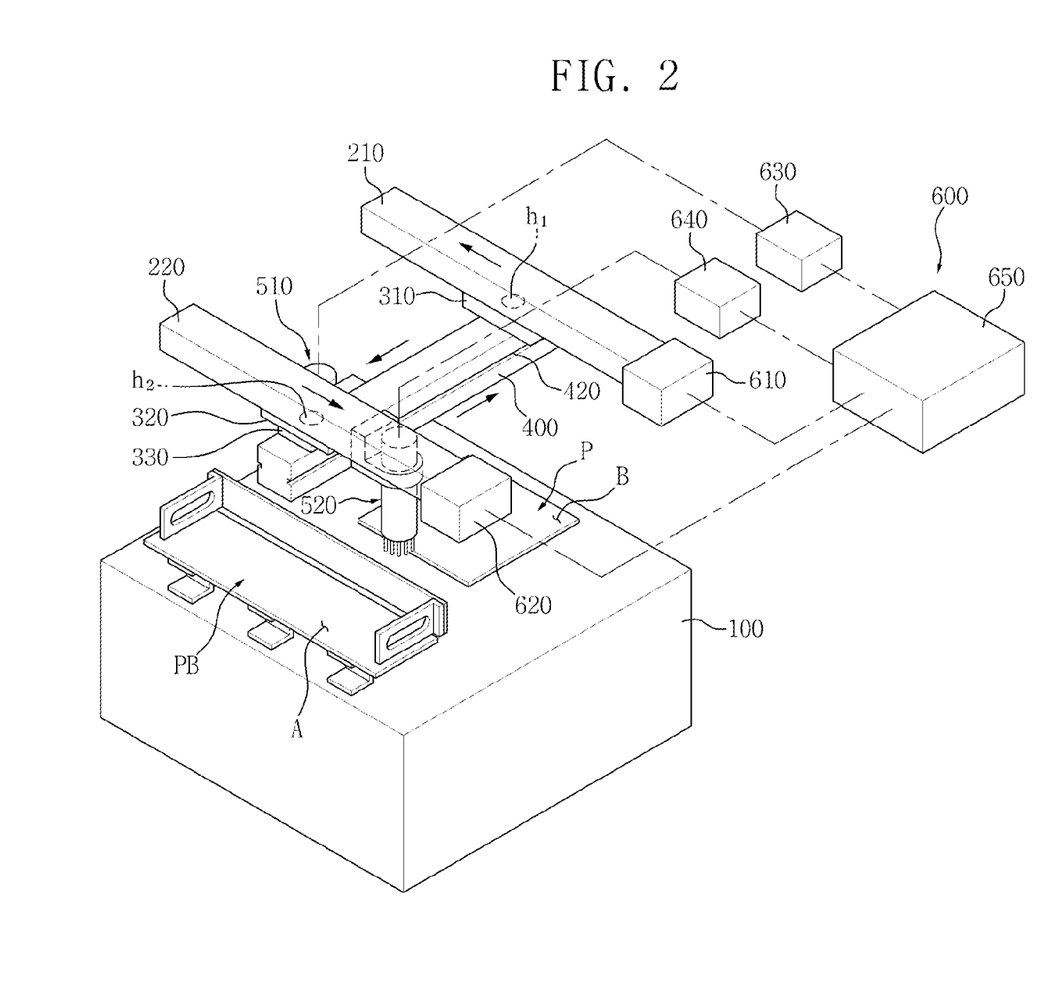
Figure 3:
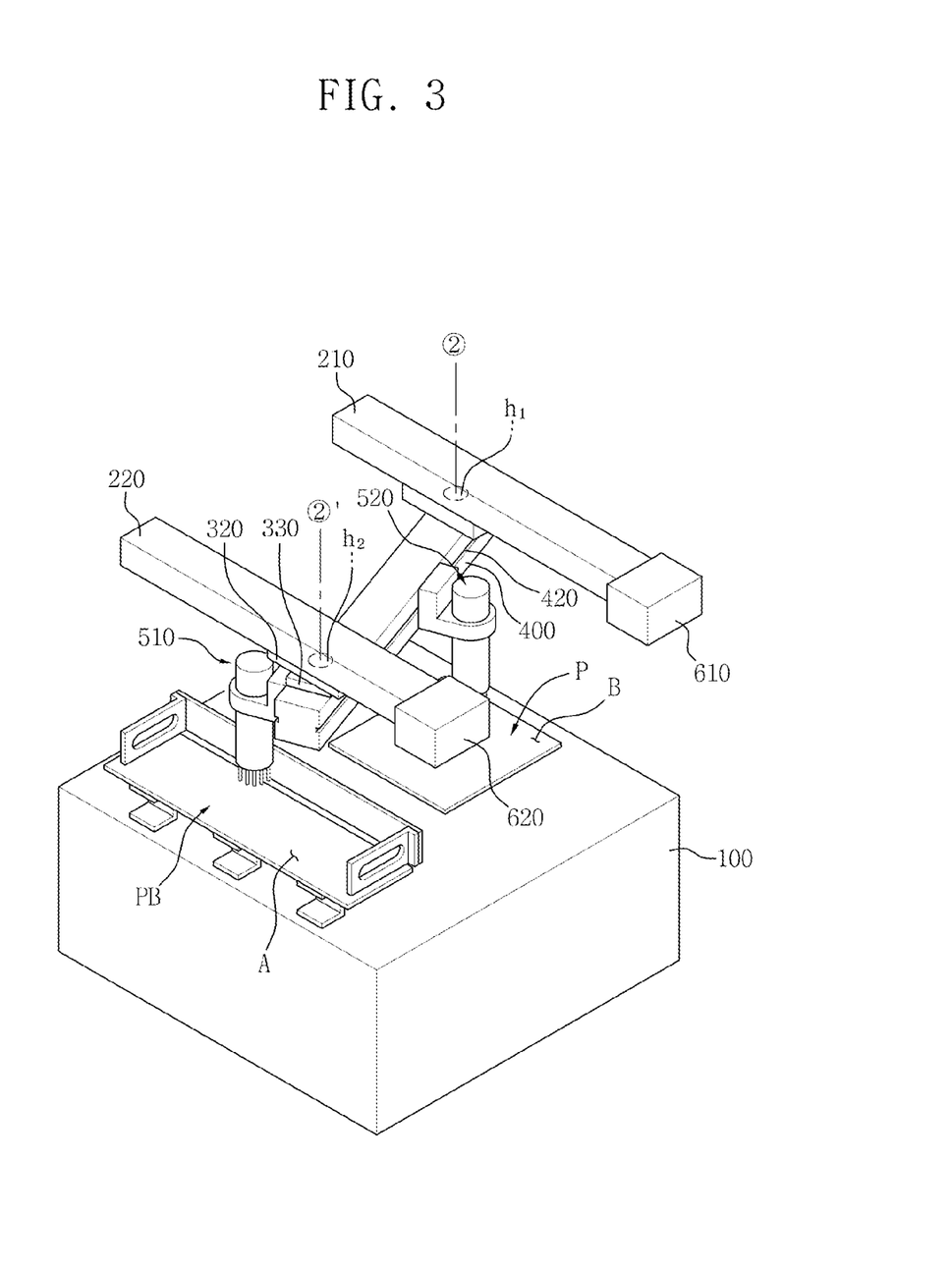
Figure 9:
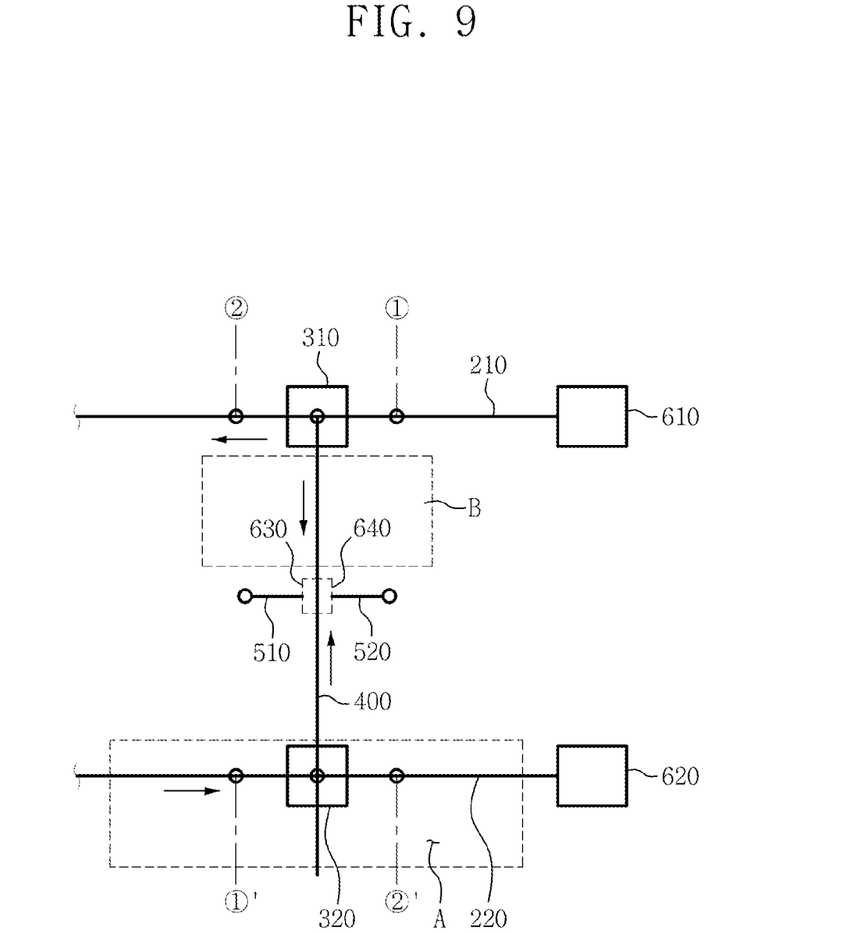

Accordingly, as illustrated in FIGS. 2, 3 and 9, the first movable block 310 moves from the first position ① toward a second position ② on the first motion guide 210, and the second movable block 320 moves from the first position ①' toward a second position ②' on the second motion guide 220.

In addition, the first head nozzle part 510 moves from one end toward the other end of the guide member 400 by a predetermined distance, and the second head nozzle part 520 moves from the other end toward the one end of the guide member 400 by a predetermined distance. Thus, the first and second head nozzle parts 510 and 520 may move in the opposite directions, and be located at predetermined positions.

The one end of the guide member 400 which is hinged to the first movable block 310 may be rotated, and the slide member 330 installed on the other end of the guide member 400 may slide. The second movable block 320 hinged to the upper end of the slide member 330 may be rotated. Here, the first head nozzle part 510 is in the state where the electronic part is not picked up, and the second head nozzle part 520 is in the state where the electronic part is picked up.

[Second Process Position]

Figure 10:
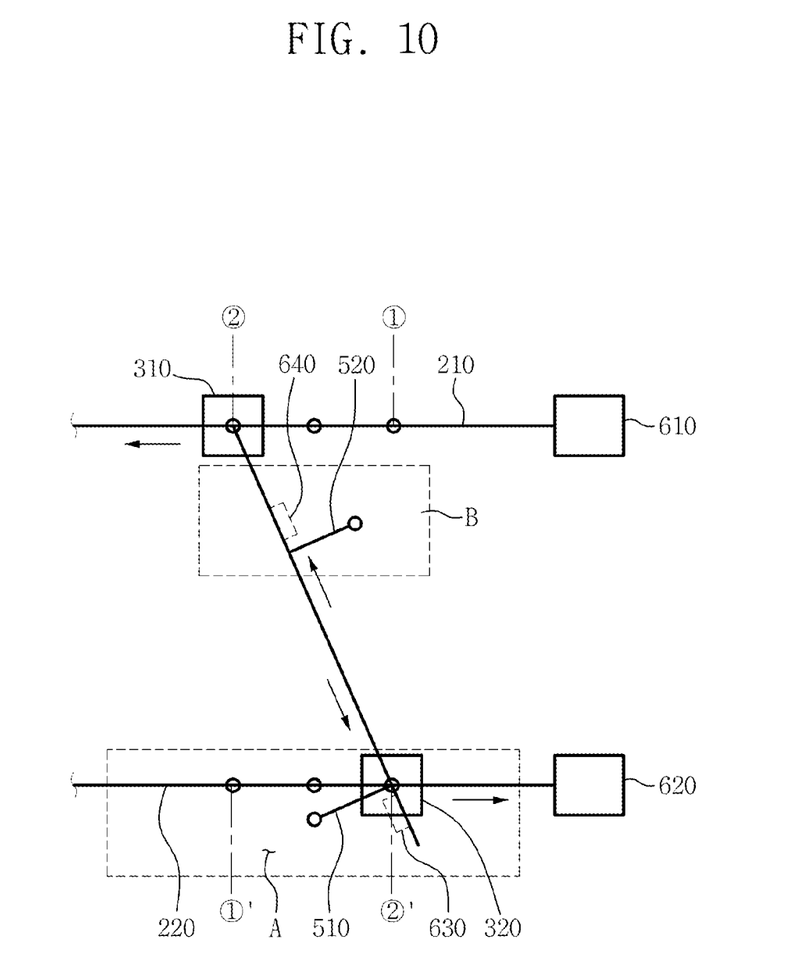

When the first and second movable blocks 310 and 320 and the first and second head nozzle parts 510 and 520 continue to move from the aforementioned first operation positions, the first movable block 310 is located at the second position ②, and the second movable block 320 is located at the second position ②', as illustrated in FIGS. 3 and 10.

In addition, the first head nozzle part 510 moves along one lateral surface of the guide member 400 to be located at the other end of the guide member 400, and the second head nozzle part 520 moves along the other lateral surface of the guide member 400 to be located at the one end of the guide member 400.

That is, the first head nozzle part 510 is located above the part feeding region A, and the second head nozzle part 520 is located above the part mounting region B having picked up the electronic part, e.g., using vacuum suction.

Thus, the first head nozzle part 510 may be in a state to pick up a supplied electronic part, and the second head nozzle part 520 may be in a state to mount the electronic part previously picked up using the second spindles 524 onto the board P located in the part mounting region B.

Accordingly, the controller 650 lowers the first spindles 514 using the first cylinder shaft 513 of the first head nozzle part 510, and the vacuum provider provides a vacuum suction to the first spindles 514 to pick up the supplied electronic part standing by in the part feeding region A using the first spindles 514.

In addition, the controller 650 lowers the second spindles 524 to the board P located at the part mounting region B using the second cylinder shaft 523 of the second head nozzle part 520, and the vacuum provider blocks the vacuum suction provided to the second spindles 524 to facilitate the electronic part pick up using the second spindles 524 to be mounted on the board P.

[Second Operation Position]

Figure 4:
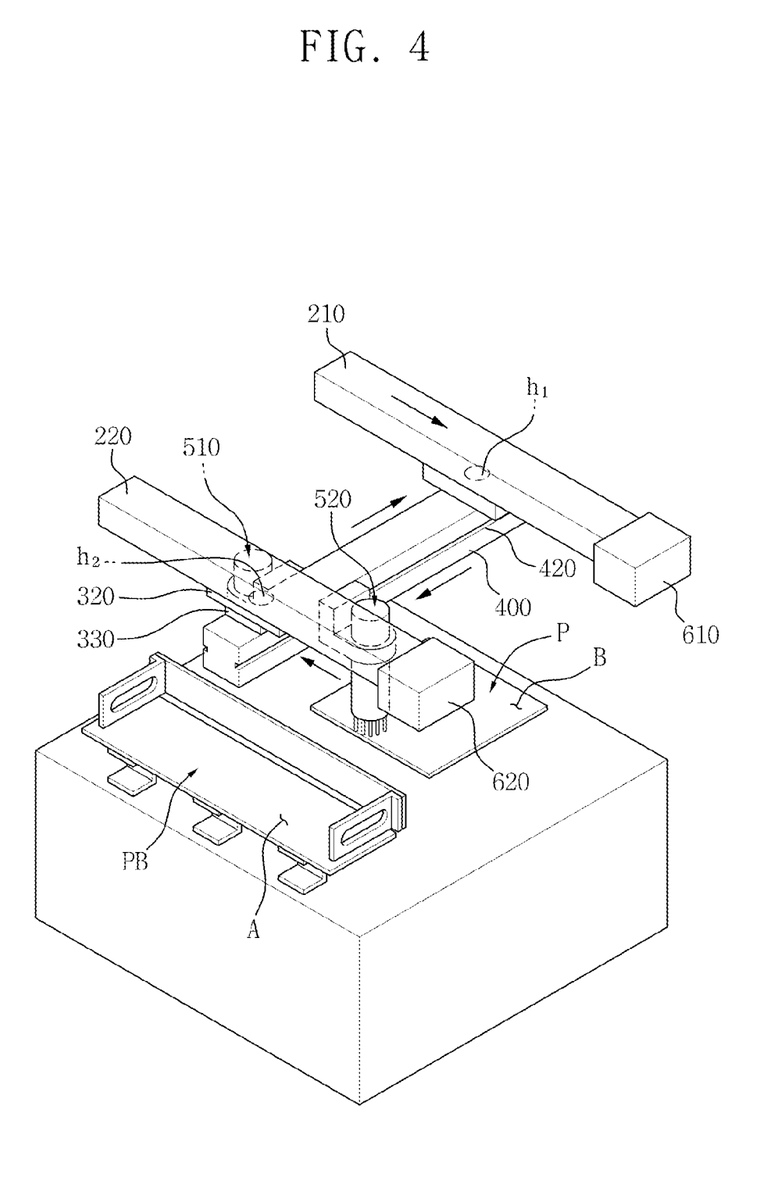

As described above, when the supplied electronic part is picked up using the first head nozzle part 510, and the electronic part previously picked up using the second head nozzle part 520 is mounted on the board P, the controller 650 operates the first and second translation motors 610 and 620 and the first and second linear motors 630 and 640 to move the first movable block 310 along the first motion guide 210 toward the first position ① to a predetermined position as well as the second movable block 320 along the second motion guide 220 toward the first position ①' to a predetermined position again, as illustrated in FIG. 4. Further, the first head nozzle part 510 moves toward the one end of the guide member 400 to a predetermined position having picked up the supplied electronic part, and the second head nozzle part 520 moves toward the other end of the guide member 400 to a predetermined position.

[Second Standby Position]

Figure 5:
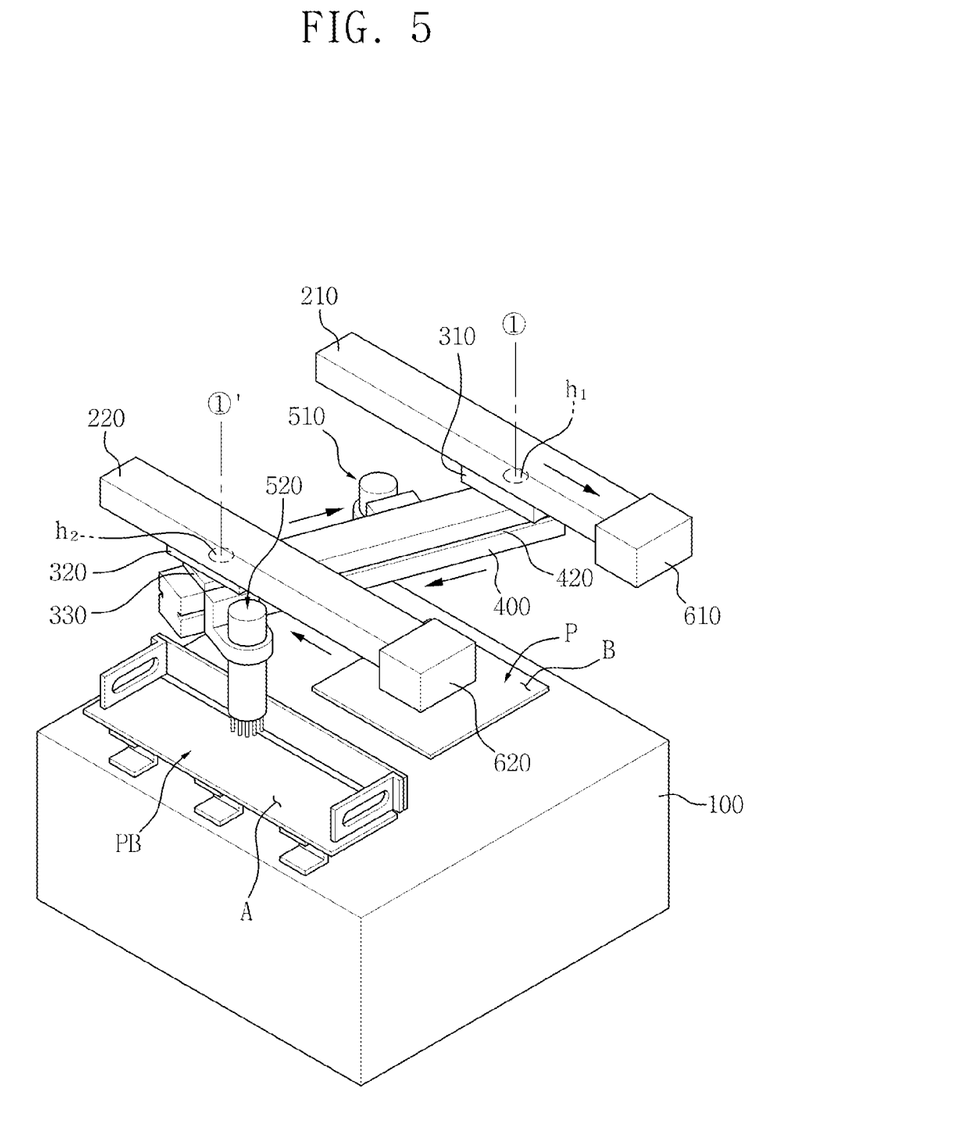
Figure 11:
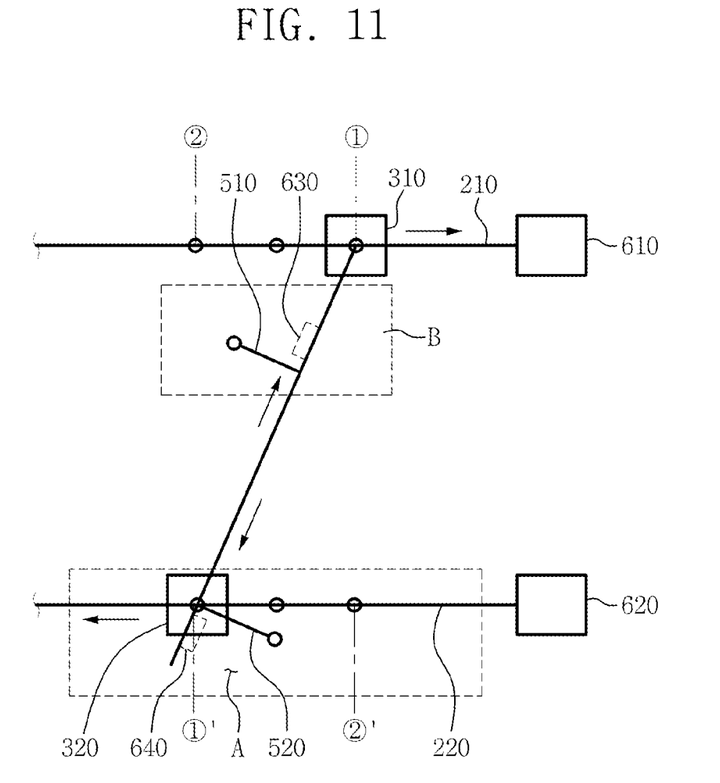
Figure 12:
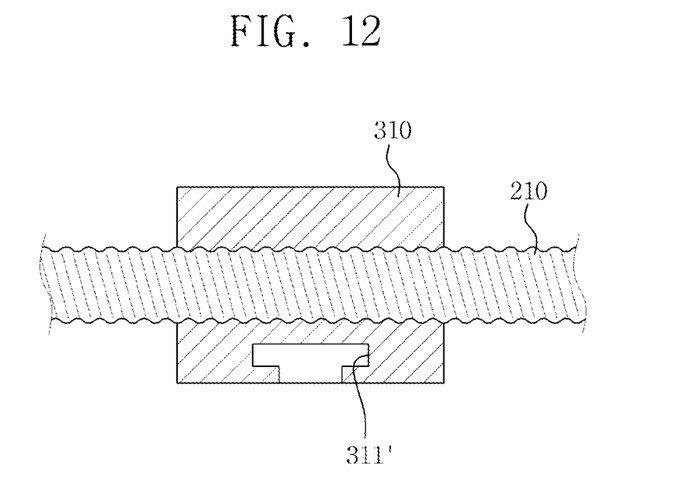
FIG. 12 is a cross-sectional view illustrating a joint relation between a motion guide, i.e. a threaded shaft of a ball screw, and a movable block according to an embodiment.

In this state, as illustrated in FIGS. 5 and 11, the controller 650 operates the first and second translation motors 610 and 620 and the first and second linear motors 630 and 640 to simultaneously move the first movable block 310 to the first position ① on the first motion guide 210 as well as the second movable block 320 to the first position ①' on the second motion guide 220.

In addition, the first head nozzle part 510 is located at the one end of the guide member 400, and the second head nozzle part 520 is located at the other end of the guide member 400.

Here, the first head nozzle part 510 is located above the part mounting region B having picked up the supplied electronic part, and the second head nozzle part 520 is located above the part feeding region A.

Thus, in this state, the first head nozzle part 510 can mount the supplied electronic part on the board P, and the second head nozzle part 520 can pick up another electronic part in the part feeding region A.

In the aforementioned process, the first movable block 310 reciprocates between the first position ① and the second position ②, and the second movable block 320 reciprocates between the first position ①' and the second position ②' in cooperation with the movement operation of the first movable block 310. The first head nozzle part 510 reciprocates between the one end and the other end of the guide member 400, and the second head nozzle part 520 reciprocates between the other end and the one end of the guide member 400 in cooperation with the movement operation of the first head nozzle part 510.

Here, the reciprocating width W1 of the first and second movable blocks 310 and 320 on the respective motion guides 210 and 220 and the reciprocating width W2 of the first and second head nozzle parts 510 and 520 on the opposite lateral surfaces of the guide member 400 may be variably set by the controller 650. In detail, since the positions for picking up and mounting the electronic parts using the first and second head nozzle parts 510 and 520 are variably set using the controller 650, the reciprocating widths W1 and W2 may be variably set according to the positions for picking up and mounting the electronic parts using the first and second head nozzle parts 510 and 520.

The controller 650 controls the first and second translation motors 610 and 620 and the first and second linear motors 630 and 640 such that the process of picking up and mounting the electronic part using the first head nozzle part 510 alternates with that of the second head nozzle part 520.

Meanwhile, the first spindles 514 of the first head nozzle part 510 may be rotated to alter an arrangement position thereof in the state where they are installed on the lower portion of the first cylinder shaft 513.

The rotation of the first spindles 514 is performed by the aforementioned first motor 515, and the rotation of the second spindles 524 of the second head nozzle part 520 is also performed by the second motor 525 to be substantially equal to that of the first spindles 514 of the first head nozzle part 510. Further, the second spindles 524 may have an XY arrangement at the lower end of the second cylinder shaft 523, or a single second spindle may be installed on the lower end of the second cylinder shaft 523.

On the other hand, for the aforementioned processes, a plurality of head nozzle units may be continuously installed on a single body 100.

According to an embodiment, a pair of head nozzle parts are configured to alternately and sequentially perform a series of mounting processes of picking up electronic parts and mounting the electronic parts, so that it is possible to improve productivity per unit time by mounting the electronic parts on the board to produce products.

Further, a pair of head nozzle parts can be disposed along one guide member to be opposite to each other and simultaneously perform one process, so that an installation space for the head nozzle parts mounted on the body of the electronic part mounting apparatus can be efficiently reduced, and thus the size of the electronic part mounting apparatus can be reduced.

In addition, a region where a pair of head nozzle parts are reciprocated is limited to a predetermined region, and the pair of head nozzle parts are operated so as not to interfere with each other, so that it is possible to prevent physical collision caused by superposition of movement paths while performing the mounting process, and thus damage to the electronic part mounting apparatus and process errors can be prevented in advance.

The apparatus described herein may comprise a processor, a memory for storing program data to be executed by the processor, a permanent storage such as a disk drive, a communications port for handling communications with external devices, and user interface devices, including a display, keys, etc. When software modules are involved, these software modules may be stored as program instructions or computer readable code executable by the processor on a non-transitory computer-readable media such as read-only memory (ROM), random-access memory (RAM), CD-ROMs, magnetic tapes, floppy disks, and optical data storage devices. The computer readable recording media may also be distributed over network coupled computer systems so that the computer readable code is stored and executed in a distributed fashion. This media can be read by the computer, stored in the memory, and executed by the processor.

The invention may be described in terms of functional block components and various processing steps. Such functional blocks may be realized by any number of hardware and/or software components configured to perform the specified functions. For example, the invention may employ various integrated circuit components, e.g., memory elements, processing elements, logic elements, look-up tables, and the like, which may carry out a variety of functions under the control of one or more microprocessors or other control devices. Similarly, where the elements of the invention are implemented using software programming or software elements, the invention may be implemented with any programming or scripting language such as C, C++, Java, assembler, or the like, with the various algorithms being implemented with any combination of data structures, objects, processes, routines or other programming elements. Functional aspects may be implemented in algorithms that execute on one or more processors. Furthermore, the invention may employ any number of conventional techniques for electronics configuration, signal processing and/or control, data processing and the like. The words "mechanism" and "element" are used broadly and are not limited to mechanical or physical embodiments, but may include software routines in conjunction with processors, etc.

For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical".

Recitation of ranges of values herein are merely intended to serve as a shorthand method of referring individually to each separate value falling within the range, unless otherwise indicated herein, and each separate value is incorporated into the specification as if it were individually recited herein. The steps of all methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed.

All references, including publications, patent applications, and patents, cited herein are hereby incorporated by reference to the same extent as if each reference were individually and specifically indicated to be incorporated by reference and were set forth in its entirety herein.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of the inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A head nozzle unit, comprising:
    a pair of motion guides located parallel to each other;
    a pair of movable blocks slidably disposed directly under the pair of motion guides and movable independently of each other;
    a guide member disposed under the pair of movable blocks, connected to the pair of movable blocks between the pair of motion guides, and moved relative to the pair of movable blocks;
    a pair of head nozzle parts respectively disposed on one lateral surface of the guide member under one end of the pair of movable blocks and the other lateral surface of the guide member under the other end of the pair of movable blocks, the pair of head nozzle parts movable independently of each other and operable to pick up and mount electronic parts; and
    a driver electrically connected to the pair of motion guides and the pair of head nozzle parts to move the pair of movable blocks and the pair of head nozzle parts in predetermined directions in cooperation with one another,
    wherein one end of the guide member is configured to rotate with respect to one of the pair of motion guides, and the other end of the guide member is configured to slide in a direction transverse to the other of the pair of motion guides.

2. The head nozzle unit according to claim 1, wherein:
    a first end of the guide member is hinged to one of the pair of movable blocks;
    a second end of the guide member is coupled with a slide member that slides along the guide member, the slide member being hinged to the other of the pair of movable blocks; and
    a lower end of the slide member is slidably fitted into a sliding rail formed on the second end of the guide member.

3. The head nozzle unit according to claim 1, wherein the guide member includes channels in the one lateral surface and the other lateral surface thereof into which rail protrusions of the pair of head nozzle parts are fitted to guide sliding of the pair of head nozzle parts.

4. The head nozzle unit according to claim 1, wherein:
    the pair of motion guides are formed as a pair of threaded shafts shaped like male screws in a pair of ball screws; and
    the pair of movable blocks are shaped like female screws in the pair of ball screws and screwed around the pair of motion guides.

5. The head nozzle unit according to claim 4, wherein the driver is connected with the pair of threaded shafts, the driver including:
    a pair of translation motors that provide a rotating force to each of the pair of threaded shafts,
    a pair of linear motors installed on the opposite lateral surfaces of the guide member and operable to move the pair of head nozzle parts, and
    a controller electrically connected with the pair of translation motors and the pair of linear motors and operable to control the pair of translation motors to be rotated in directions opposite or equal to each other and to control operation of the pair of linear motors.

6. The head nozzle unit according to claim 5, wherein:
    the pair of motion guides restrict movement widths of the pair of movable blocks thereunder, respectively;
    the controller reciprocates the pair of movable blocks within the movement widths using the pair of translation motors, and simultaneously reciprocates the pair of head nozzle parts disposed on the guide member along the guide member using the pair of linear motors; and
    the movement widths are variably set according to positions for picking up and mounting the electronic parts using the pair of head nozzle parts by the controller.

7. The head nozzle unit according to claim 6, wherein:
the pair of movable blocks are in contact with the motion guides and reciprocated within the movement widths to be moved in directions corresponding to each other to be located at positions separated from each other; and
the pair of head nozzle parts are reciprocated along the guide member to be moved in directions corresponding to each other to be located at positions opposite to each other with the guide member being therebetween.

8. The head nozzle unit according to claim 6, wherein:
the pair of movable blocks are in contact with the motion guides and reciprocated within the movement widths in opposite directions to each other on both ends of the guide member; and
the pair of head nozzle parts are reciprocated along the guide member in opposite directions to each other with the guide member being therebetween.

9. An apparatus for mounting electronic parts, comprising:
a body having a part feeding region to which the electronic parts are fed, and a part mounting region which is spaced apart from the part feeding region by a predetermined distance to hold a board on which the electronic parts are mounted; and
a head nozzle unit disposed above the body and including a pair of head nozzle parts that are alternately reciprocated between the part feeding region and the part mounting region to pick up the electronic parts from the part feeding region and then mount the electronic parts on the board in the part mounting region.

10. The apparatus according to claim 9, wherein the head nozzle unit further includes:
a pair of motion guides disposed above the pair of head nozzle parts and parallel to each other;
a pair of movable blocks slidably disposed under the pair of motion guides and movable independently of each other;
a guide member connected to the pair of movable blocks between the pair of head nozzle parts under the pair of movable blocks and configured to slide with respect to at least one of the pair of motion guides together;
a driver electrically connected to the pair of movable blocks and the pair of head nozzle parts and configured to move the pair of movable blocks and the pair of head nozzle parts in predetermined directions in cooperation with one another; and
wherein the pair of head nozzle parts are disposed on opposite lateral surfaces of the guide member and movable independently of each other to be alternately located in the part feeding region and the part mounting region to pick up and mount the electronic parts.

11. The apparatus according to claim 10, wherein:
a first end of the guide member is hinged to one of the pair of movable blocks;
a second end of the guide member is coupled with a slide member that slides along the guide member, the slide member being hinged to the other of the pair of movable blocks; and
a lower end of the slide member is slidably fitted into a sliding rail formed on the second end of the guide member.

12. The apparatus according to claim 10, wherein the guide member includes rail channels in the opposite lateral surfaces thereof into which rail protrusions of the pair of head nozzle parts are fitted to guide sliding of the pair of head nozzle parts.

13. The apparatus according to claim 10, wherein:
the pair of motion guides are formed as a pair of threaded shafts of ball screws; and
the pair of movable blocks are screwed around the pair of threaded shafts.

14. The apparatus according to claim 13, wherein the driver is connected with the pair of threaded shafts, the driver including:
a pair of translation motors that provide a rotating force to each of the pair of threaded shafts,
a pair of linear motors installed on the opposite lateral surfaces of the guide member and operable to move the pair of head nozzle parts, and
a controller electrically connected with the pair of translation motors and the pair of head nozzle parts and operable to control the pair of translation motors to be rotated in directions opposite or equal to each other and to control operation of the pair of linear motors.

15. The apparatus according to claim 14, wherein:
the pair of motion guides restrict movement widths of the pair of movable blocks, respectively;
the controller reciprocates the pair of movable blocks within the movement widths using the pair of translation motors, and simultaneously reciprocates the pair of head nozzle parts disposed on the guide member along the guide member using the pair of linear motors; and
the movement widths are variably set for the controller.

16. The apparatus according to claim 15, wherein:
the pair of movable blocks are reciprocated within the movement widths to be moved in directions corresponding to each other to be located at positions opposite to each other; and
the pair of head nozzle parts are reciprocated along the guide member to be moved in directions corresponding to each other to be located at positions opposite to each other.

17. The apparatus according to claim 15, wherein:
the pair of movable blocks are reciprocated within the movement widths in opposite directions; and
the pair of head nozzle parts are reciprocated along the guide member in opposite directions.

* * * * *